United States Patent [19]

Leach

[11] Patent Number: 5,184,032
[45] Date of Patent: Feb. 2, 1993

[54] GLITCH REDUCTION IN INTEGRATED CIRCUITS, SYSTEMS AND METHODS

[75] Inventor: Jerald G. Leach, Houston, Tex.

[73] Assignee: Texas Instruments Incorporated, Dallas, Tex.

[21] Appl. No.: 691,266

[22] Filed: Apr. 25, 1991

[51] Int. Cl.[5] .......................................... H03K 17/19
[52] U.S. Cl. ................................. 307/443; 307/362; 307/481
[58] Field of Search ............... 307/443, 542, 542.1, 307/279, 290, 480, 481, 601, 602, 268, 362, 452, 451

[56] References Cited

U.S. PATENT DOCUMENTS

| | | | |
|---|---|---|---|
| 3,851,189 | 11/1974 | Moyer | 307/279 |
| 3,971,960 | 7/1976 | Means et al. | 307/279 X |
| 4,065,715 | 12/1977 | Jaffe et al. | 307/362 X |
| 4,641,049 | 2/1987 | Fukuzo | 307/590 |
| 4,760,283 | 7/1988 | Weaver | 307/443 X |
| 4,782,253 | 11/1988 | Shoji | 307/602 |
| 4,786,824 | 11/1988 | Masuda | 307/279 X |
| 4,800,304 | 1/1989 | Takeuchi | 307/602 |
| 4,808,855 | 2/1989 | Lloyd | 307/480 |
| 4,813,021 | 3/1989 | Kai et al. | 365/194 |
| 4,820,942 | 4/1989 | Chan | 307/542 |
| 4,839,538 | 6/1989 | Curtis | 307/456 |
| 4,890,016 | 12/1989 | Tanaka et al. | 307/443 |
| 4,918,339 | 4/1990 | Shigeo et al. | 307/443 X |
| 4,953,130 | 8/1990 | Houston | 365/203 |
| 4,965,474 | 10/1990 | Childers et al. | 307/542 |
| 4,985,640 | 1/1991 | Grochowski et al. | 307/269 |
| 5,036,222 | 7/1991 | Davis | 307/443 |

*Primary Examiner*—David Hudspeth
*Attorney, Agent, or Firm*—James F. Hollander; Rene Grossman; Jay Cantor

[57] ABSTRACT

An integrated circuit has a clock input pad and circuitry operative in response to a clock signal. Clock transitions at the clock input pad are potentially subject to glitches due to noise and ringing. Further provided is a glitch remover circuit having a logic gate having first and second inputs. The glitch remover circuit has a series of circuits coupled to the clock input pad with differing delays for positive edges than for negative edges. The series of circuits has an output connected to the first input of the logic gate, with the second input coupled to the series of circuits intermediately. Other devices, systems and methods are also disclosed.

16 Claims, 9 Drawing Sheets

GLITCH REDUCTION IN INTEGRATED CIRCUITS, SYSTEMS AND METHODS

NOTICE

© Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications and patents are hereby incorporated herein by reference:

| Ser. No. | Filing Date | TI Case No. |
| --- | --- | --- |
| 590,106 | 09/28/90 | TI-14610 |
| 594,174 | 10/9/90 | TI-15416 |
| U.S. Pat. No. 4,953,130 filed 6/27/88. | | |

FIELD OF THE INVENTION

This invention generally relates to glitch reduction in integrated circuits and systems and methods for glitch reduction.

BACKGROUND OF THE INVENTION

Without limiting the scope of the invention, its background is described in connection with microcomputers, as an example.

Glitches can occur on clock inputs due to ringing and overshoots on the input buffer, or noise superimposed on the clock input. These glitches can cause extra increments of the clock logic. A Schmitt-trigger can be used to clean up edges when the clock is switching. However, Schmitt-triggers have hysteresis, which causes the high and low threshold level to be different if the input switches high than if the input switches low. This decreases the margins for low and high input voltage specifications. Large glitches may cause input circuitry to fail.

SUMMARY OF THE INVENTION

Generally, and in one form of the invention, an integrated circuit has a clock input pad and circuitry operative in response to a clock signal. Clock transitions at the clock input pad are potentially subject to glitches due to noise and ringing. Further provided is a glitch remover circuit having a logic gate having first and second inputs. The glitch remover circuit has a series of circuits coupled to the clock input pad with differing delays for positive edges than for negative edges. The series of circuits has an output connected to the first input of the logic gate, with the second input coupled to the series of circuits intermediately. Other forms of the invention are also disclosed and claimed.

An advantage of the invention is that reliability of operation is improved by reducing circuit susceptibility to glitches due to noise and ringing.

BRIEF DESCRIPTION OF THE DRAWINGS

In the drawings:

FIGS. 1a–1d illustrate noise and ringing causing glitches on a clock input. FIG. 1a shows ringing at the pad.

Corresponding numerals and symbols in the different figures refer to corresponding parts unless otherwise indicated.

DETAILED DESCRIPTION OF PREFERRED EMBODIMENTS

Figure 2:
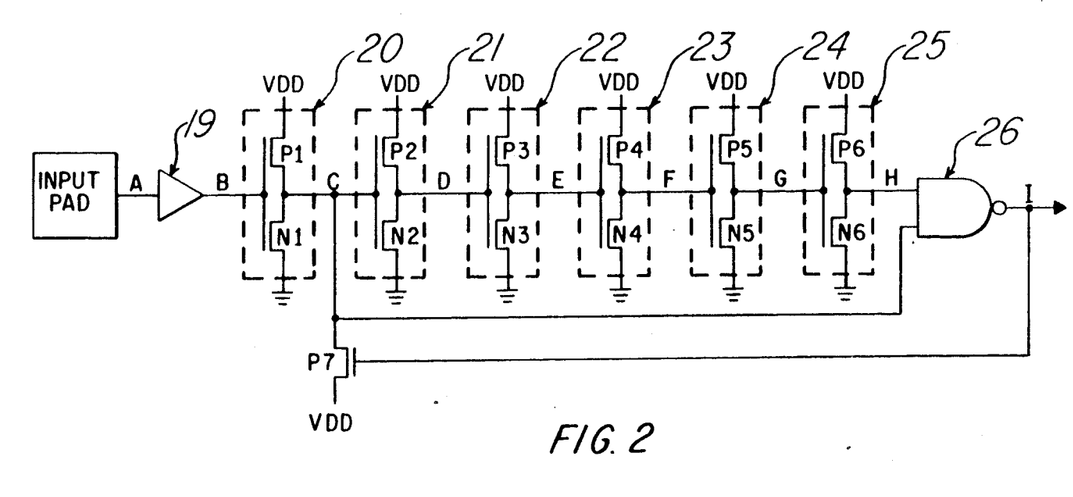
FIG. 2 illustrates the circuit arrangement of a preferred embodiment.
Figure 3A:
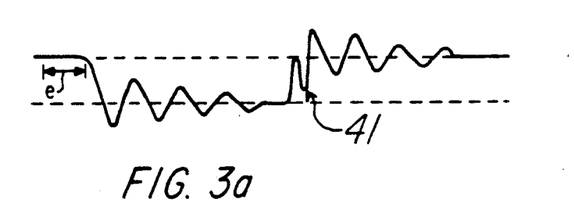
FIGS. 3A–3I illustrate how glitches are filtered input signal in series of voltage-versus-time waveform diagrams A–I.
Figure 3B:
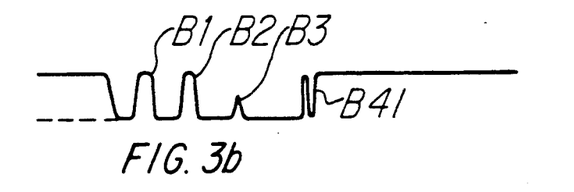
Figure 3C:
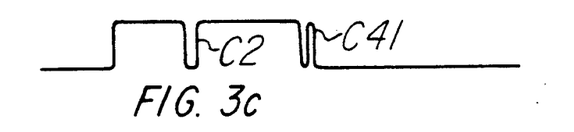
Figure 3D:
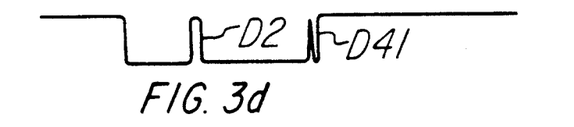
Figure 3E:
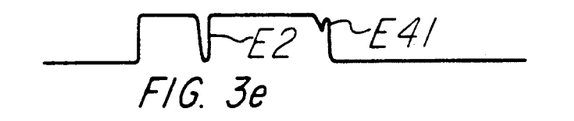
Figure 3F:
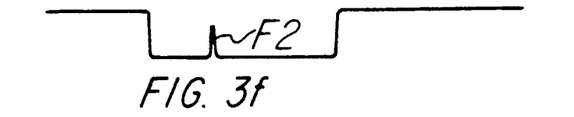
Figure 3G:
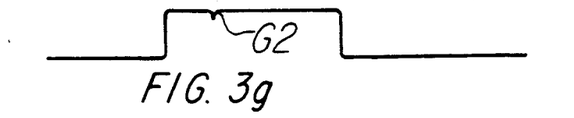
Figures 3H, 3I:
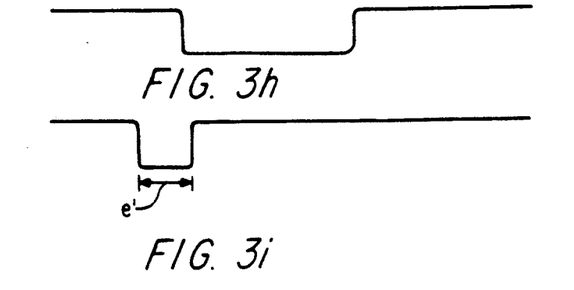

A preferred embodiment uses a one shot circuit of FIG. 2 to filter out positive input glitches which are not long enough to propagate through the one shot. After input pad A goes high long enough to propagate through the one shot, a negative going edge will trigger the one shot. The input to the one shot node C is clamped high to insure the output pulse is stable and glitches do not propagate to the output. The delay of the negative going input is minimum. This preferred embodiment is advantageously usable to improve communication ports of the 320C40 digital signal processor of Texas Instruments, which is described in incorporated patent applications Ser. No. 590,106, Ser. No. 540,107, Ser. No. 589,968, Ser. No. 590,625, and Ser. No. 590,372, all of which are hereby incorporated herein by reference.

Figure 1A:
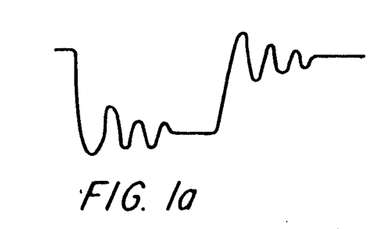
Figure 1B:
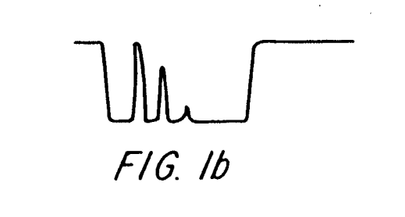
FIG. 1b shows a ringing signal after input buffer.

The beta ratios of the one shot inverters filter out positive input glitches of FIGS. 1a–1d. In FIG. 1a, at the clock input ringing occurs. Once the ringing goes through an input buffer without glitch removal, the signal is disadvantageously amplified as shown in FIG. 1b. The faster the input switches, the worse the ringing becomes.

Figures 1C, 1D:
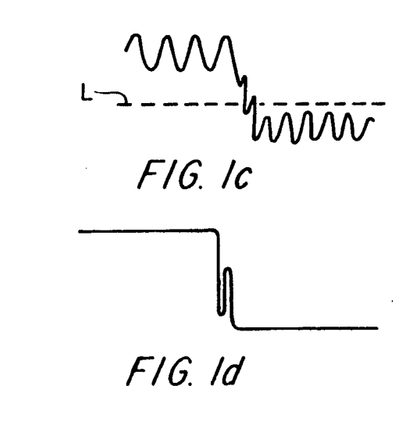
FIG. 1c shows noise superimposed on the pad.
FIG. 1d shows noisy signal after input buffer.

Noise on the input is shown in FIG. 1c. The noise produces a glitch just as the input switches, or transitions through a switching voltage level L. The amplified output has a resulting glitch as shown in FIG. 1d.

In FIG. 2, the glitch removing circuit has a series of inverters 21–25 with alternating beta ratios. The advantageous result is that the falling edge at node C is a fraction (e.g. half) as fast going through inverters 21–25 as the rising edge. By the time the signal gets from node C to node H, the circuit filters out the pulses, and the glitch gets smaller and smaller and then disappears. When NAND gate 26 has both inputs go high, the output comes back low to the gate of a transistor P7 (p-channel) and clamps the node C to VDD. Transistor P7 has its source and drain connected between the second input of NAND gate 26 and voltage supply conductor VDD. The NAND gate 26 output is connected to the gate of transistor P7. So if the input does switch, the node C will not switch because it is clamped. The ratio of inverters gets rid of any glitches at any time after that.

The circuit has its parameters selected by the skilled worker to accommodate the length of pulses to filtered in any particular case.

As noted above glitches can occur on clock inputs as in FIG. 1 due to ringing and overshoots when the input switches, or due to noise superimposed on the clock input when switching. If a Schmitt-trigger is used to filter out noise which occurs on clock edges, hysteresis causes the switching level to be different when the input switches high than when the input switches low. This decreases the margins on the low and high voltage input specification. The hysteresis is usually only a few tenths of a volt. Input noise greater than a few tenths of a volt hysteresis in a Schmitt trigger, occurring when a input is switching, could cause extra input pulses. Glitches which are at a higher voltage than the switching voltage of the input buffer can also cause extra input pulses.

One advantage of this preferred embodiment is to provide an input circuit which filters out input glitches, but does not degrade the margins on the low or high input voltage specification of a given clock input circuit.

Another advantage is that an input circuit is provided which filters out input glitches which are less than a predetermined duration, regardless of their voltage magnitude.

Another advantage of this preferred embodiment is that an input circuit is provided which generates an input pulse width of predetermined duration, with little delay from the input pad signal.

The preferred embodiment uses a one shot and associated inverters as shown in FIG. 2 to filter noise glitches on input signals. The n-channel to p-channel device ratios (W/L) of the one shot inverters 21–25, filter out negative glitches at node C by assuring that a positive going signal at node C will propagate to node H faster than a negative going signal at node C will propagate to node H.

Devices N2,P3,N4,P5,N6 are wide and short while devices P2,N3,P4,N5,P6 are long and skinny. For the present purposes, device length is the distance across the channel from the source to the drain. Device width is the perpendicular dimension representing the number of microns along each side of the channel. The ratio of width to length (W/L) of a FET, together with its carrier mobility K relate to its current-carrying and transconductance characteristics directly and not inversely. In each cascaded circuit, beta is the ratio of W/L in an upper device to ratio W/L in a lower device. Thus, beta is a ratio of ratios.

As a result of the dimensional choices, the width of a negative glitch will decrease as it propagates through each of the five inverters as illustrated in FIG. 3. Prefix N means n-channel device, and prefix P indicates p-channel device. Each of the inverters has an lower n-channel device and an upper p-channel device.

The series of inverter circuits includes at least three circuits and each of the circuits has a field effect transistor device and the width to length (W/L) ratio of the field effect transistor device is substantially the same in a first and third circuit and different from a second circuit between them in the series of circuits. Each of the circuits also has a second field effect transistor device of opposite conductivity type and the width to length (W/L) ratio of the second device is substantially the same as the ratio for the second device in a first and third circuit in the series of circuits and different from a second circuit between them in the series of circuits.

The proportions of the n-channel device in each inverter are roughly similar to the proportions of the p-channel device in the next-subsequent inverter. Also, the proportions of the p-channel device in each inverter are roughly similar to the proportions of the n-channel device in the next subsequent inverter. The series of inverters can have any number and preferably includes at least four inverters with alternating threshold values. Delay circuits other than inverters can also be used. Advantageously, one edge propagates faster than the opposite edge.

The delay of positive and negative going signals can be adjusted to filter out pulses less than a predetermined width. The standard TTL output voltage specification is VOL 0.8 volts and VOH 2.0 volts. For a 5 volt power supply, the switching point of TTL-to-CMOS buffer 19 is skewed toward ground. As a result, ringing is more likely to generate glitches when the input goes low 0.8 volts) than when the input goes high (2.0 volts), as illustrated in FIG. 1. Ringing can cause glitches which are delayed significantly from the time the signal switches. For this reason it is chosen to filter positive input glitches of node B which correspond to negative glitches at node C due to inverter 20. Positive glitches are to be filtered out if they occur at any time during the clock cycle. Negative glitches on the input pad are filtered out if they occur soon after the rising edge of the input clock, as illustrated in FIG. 3. In this case, the negative glitch 41 at node A looks like a negative glitch at node C. Negative glitches at node C are filtered out by the inverters.

The inverters are so effective that the clamp transistor P7 can be omitted in some embodiments. On the other hand, the clamping can be so effective that the alternating beta ratio feature can be omitted in a series of circuits of other embodiments. In the preferred embodiment of FIG. 2, both clamping and alternating beta work together with remarkable effectiveness.

After node C is low for a long enough period to propagate to a high at node H, a positive going edge at node C triggers the one shot. Node C is clamped high by the one shot output I to insure the output pulse I remains low for a predetermined time period. This period is the propagation delay of a positive going signal at node C to a negative going signal at node H. P-channel FET P7 has a strong current drive capability to overdrive N1 and clamp node C high. Any glitches occurring during this time are filtered out. It is preferred to have as little delay as possible from the pad input A to the internal clock I. This prevents possible skew problems between the internal clock I and external clocks, as well as skew of set up and hold times for data latched by the clock input I. The propagation delay of a negative going signal at the pad to a negative going pulse at node (I) is minimum. This delay is due to the input buffer 19, inverter 20 and NAND gate 26.

In this way logic is provided which filters out glitches by insuring that an input signal will propagate faster when switching in one direction than if switching in the other direction. The logic uses a one shot to clamp an input clock to filter out glitches and guarantee a clock is a predetermined width. Another way of describing the one-shot clamping part of the operation is that an ending interval e of the clock input waveform, where it is relatively unvarying after ringing has died down, is delayed. The signal thus delayed is NANDed with a subsequent initial interval e' just after a following transition to clamp the waveform in the initial interval e' in response to the just previous voltage of ending interval e.

The interval e' is called the operating period of the one shot herein. The clock period of the clock circuit is regarded as the period of one complete cycle of high and low, or the reciprocal of the repetition rate of the clock feeding the one-shot glitch suppression circuit. The operating period is suitably set between 5% and 25% of the clock period to provide an operating period of significant length, and yet short enough to avoid ringing in the ending interval e, when ringing is present and interval e is about the same as interval e'. At 40 MHz., the operating period would be between about 1 and 6 nanoseconds for instance.

FIG. 3 shows waveforms at nodes A,B,C,D,E,F,G,H and output I in FIG. 2. Noise on the clock pulse at node A produces a glitch at point 41. After buffering, the waveform at node B has noise glitches B1, B2 and B3 from the noise, and glitch B41 from the transition. Inversion at node C eliminates glitch B3, and B1 is eliminated due to output J clamping node C high through P channel FET P7. Inversion at nodes D, E, and F filters glitch 41 as indicated by D41 and E41 until this glitch is eliminated at node F. Inversion at nodes D, E, F, G, and H filters glitch C2 until it is eliminated at node H. The waveform at node H is a clean pulse which is NANDed by gate 26 with the waveform at C, thereby producing the output I. Transistor P7 clamps, and a clean clock output at I is provided every clock cycle. Clock output I can be used as a clock signal in its own right or used to toggle a flip-flop or drive other clock generating circuitry to derive whatever clocks are desired for an integrated circuit.

FIGS. 4-9 show circuit applications. It is contemplated that these and other circuit applications are improved with glitch protection circuits and methods as disclosed herein. A description of these circuit applications is next provided. For further circuit, device and system information see coassigned patent application Ser. No. 590,106 filed Sep. 28, 1990 which is hereby incorporated herein by reference. FIGS. 4-9 correspond to FIGS. 7a, 14, 1, 33, 19, and 29 in the incorporated application. Numerals in FIGS. 4-9 correspond to the numerals in the corresponding figures of the incorporated application.

Figure 4:
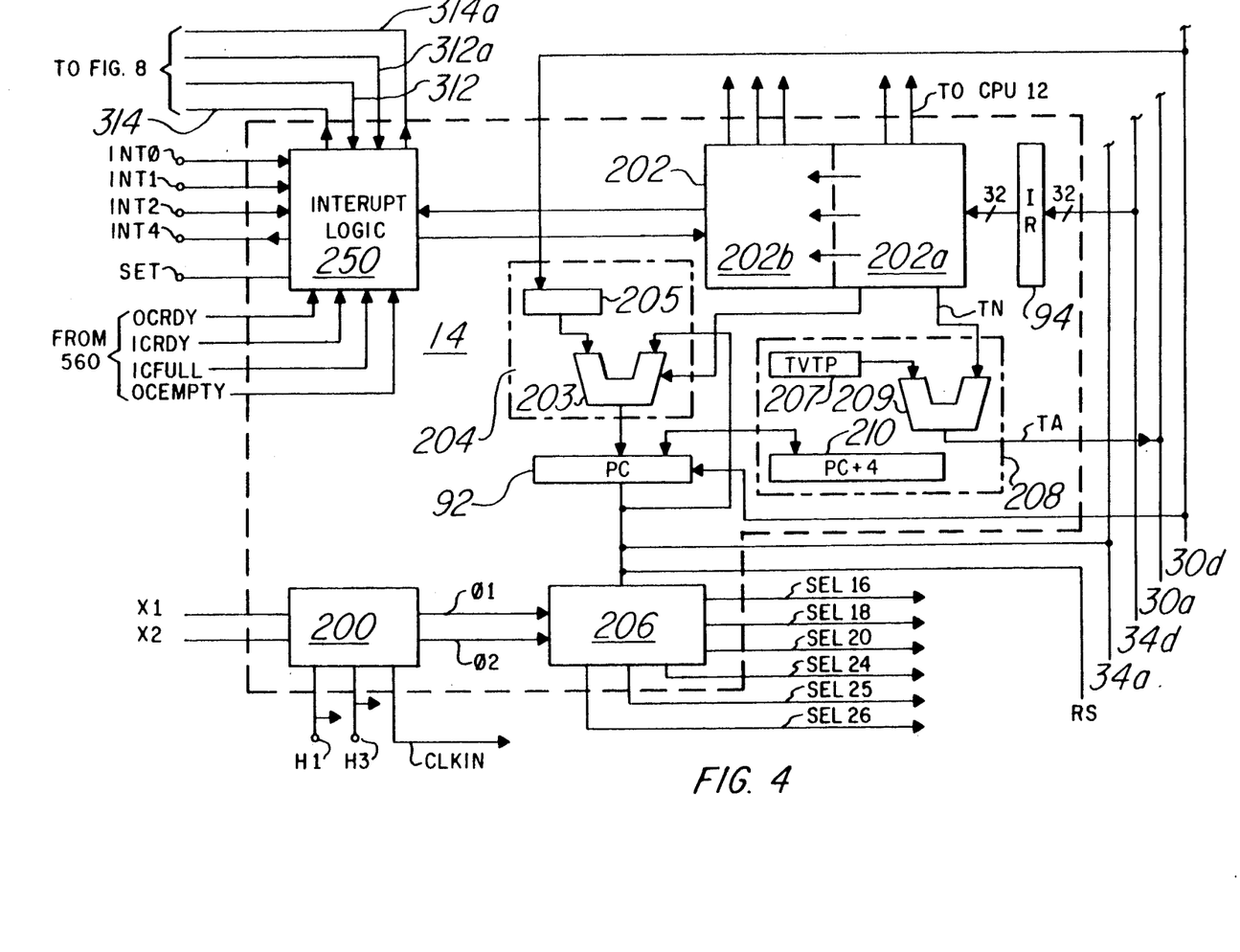
FIG. 4 is a schematic diagram of a section of a microcomputer to which glitch protection is applied.

FIG. 4 illustrates controller 14 of microcomputer 10 which controls the operation of the rest of microcomputer 10 so that the desired operation specified by the instruction codes is properly executed.

Clock generator 200 in controller 14 is improved with the circuit of FIG. 2 and connected to terminals X1 and X2 and generates the internal clock signals which are used in microcomputer 10, for example the system clock on line CLKIN. If a crystal is connected between terminals X1 and X2, clock generator 200 by an internal oscillator generates the system clock signal on line CLKIN. Alternatively, an externally-generated clock can be applied to terminal X2, in which case the externally-generated clock signal generates (such as by a divide-by-n in clock generator 200) the system clock signal on line CLKIN. Clock generator 200 further generates clock signals Q1 and Q2 which occur on the first and third quarter-cycles of the period of the clock signal on line CLKIN, however generated. Clock signals Q1 and Q2 are used by memory access arbitration logic 206 in controller 14, as described in the incorporated patent application. Additionally, clock signals H1 and H3 are generated and applied to the external terminals of the microcomputer 10. Clock signals H1 and H3 have periods equal to twice CLKIN. However generated, clock signals H1 and H3 are used by the communication ports, the CPU and other internal devices, and externally connected devices.

Figure 5:
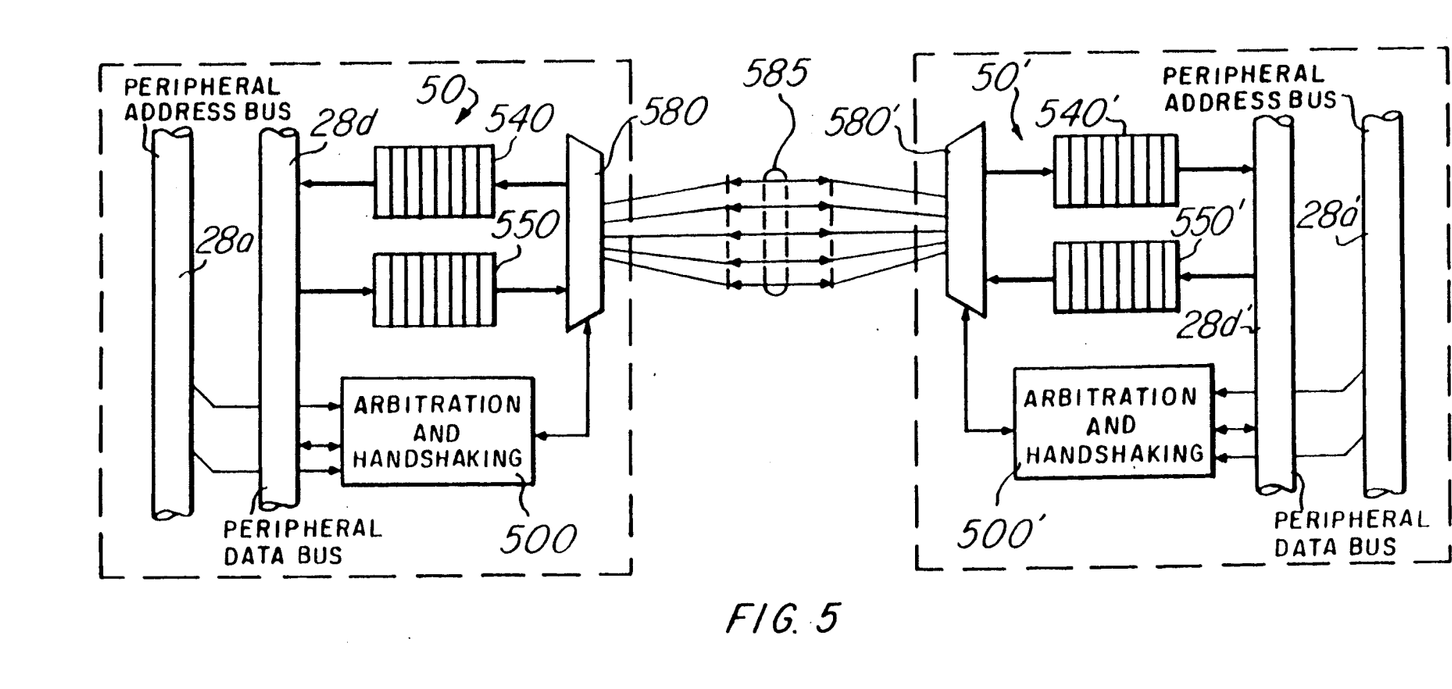
FIG. 5 is an electrical block diagram of interconnected communication ports to which glitch protection is applied in two connected microcomputers.

FIG. 5 illustrates the connection between two microcomputers 10 where one communication port is connected to another communication port in the other processor via control and data signals 585. When two microcomputers 10 are coupled via the communication ports, input and output FIFO registers 540 and 550 are coupled and the number of intercommunicating FIFO registers is doubled. The circuit is improved by having setup registers in registers 5540, 550, 540', 550' clocked with clock signals from glitch suppression circuitry of FIG. 2. The two microcomputers suitably have pin for pin compatibility so that they can directly connected via any one of six communication ports 50-55.

Figure 6:
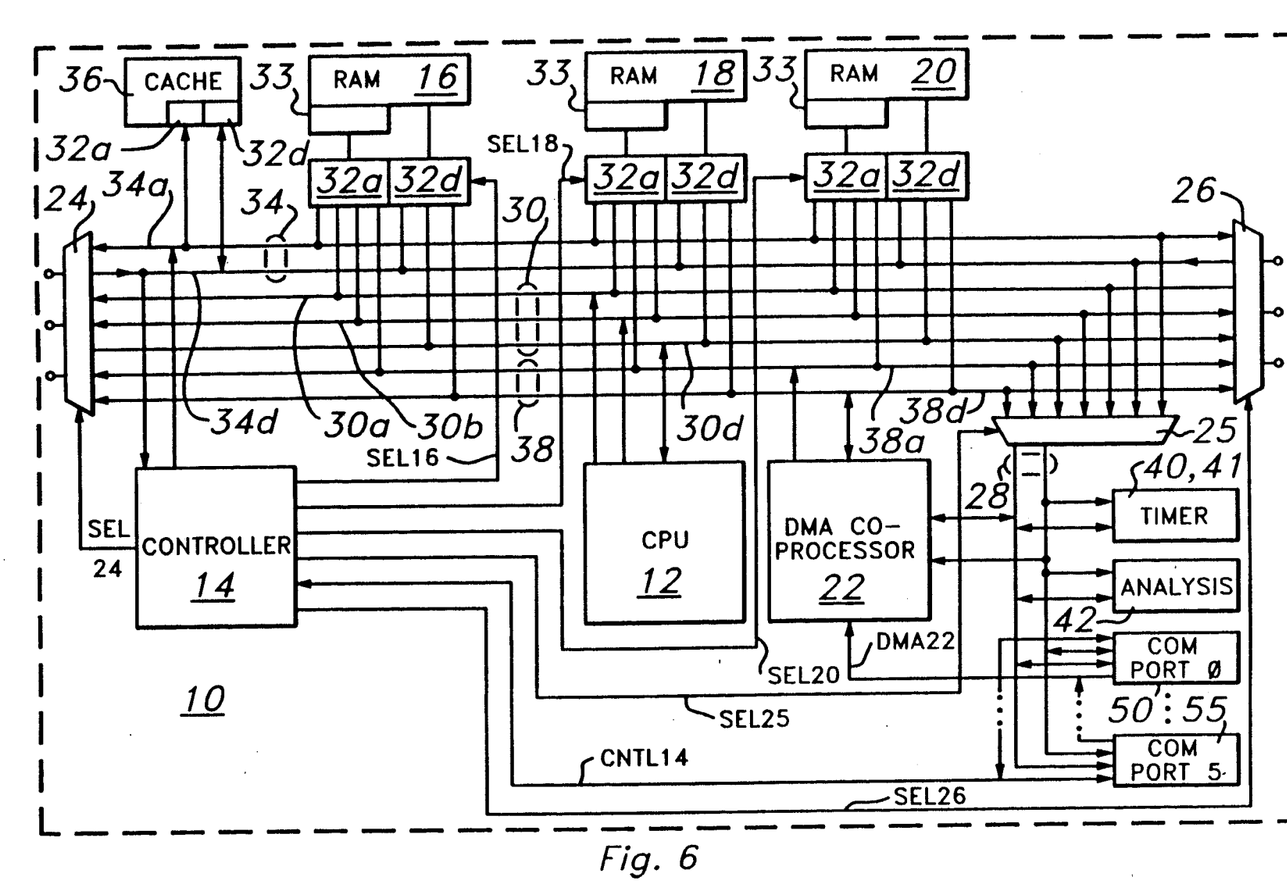
FIG. 6 is an electrical block diagram of one of the microcomputers to which glitch protection is applied.

In FIG. 6, an architecture is shown for an example microcomputer to which are applied the glitch improvements described herein. Microcomputer 10 has a central processing unit 12, a controller 14, and a direct memory access (DMA) coprocessor 22. Random access memories (RAMs) 16 and 18 and a read-only memory (ROM) 20 are provided and protected. External connection is made by way of peripheral ports 24 and 26, which multiplex various bus signals onto external terminals of microcomputer 10 and which provide special purpose signals for communication to external devices which are to receive and send data via the external terminals. Data bus 30 contains a set of data lines 30d which communicate data signals among memories 16, 18 and 20, peripheral ports 24, 25 and 26 and CPU 12. Bus 30 contains 32 address lines in each of sets 30a and 30b which are also connected among CPU 12, peripheral ports 24, 25 and 26 and memories 16, 18 and 20.

Instruction cache 36 is a small high speed memory which retains most recently used instruction codes, so that when external memory devices are used for program storage, the retrieval of repetitively used instructions is effected at substantially the same rate as from the on-board memories.

Glitch protection as described herein is applied to any or all of the clock input circuits of integrated circuit 10, to RAM and ROM memories, and peripherals generally.

Figure 7:
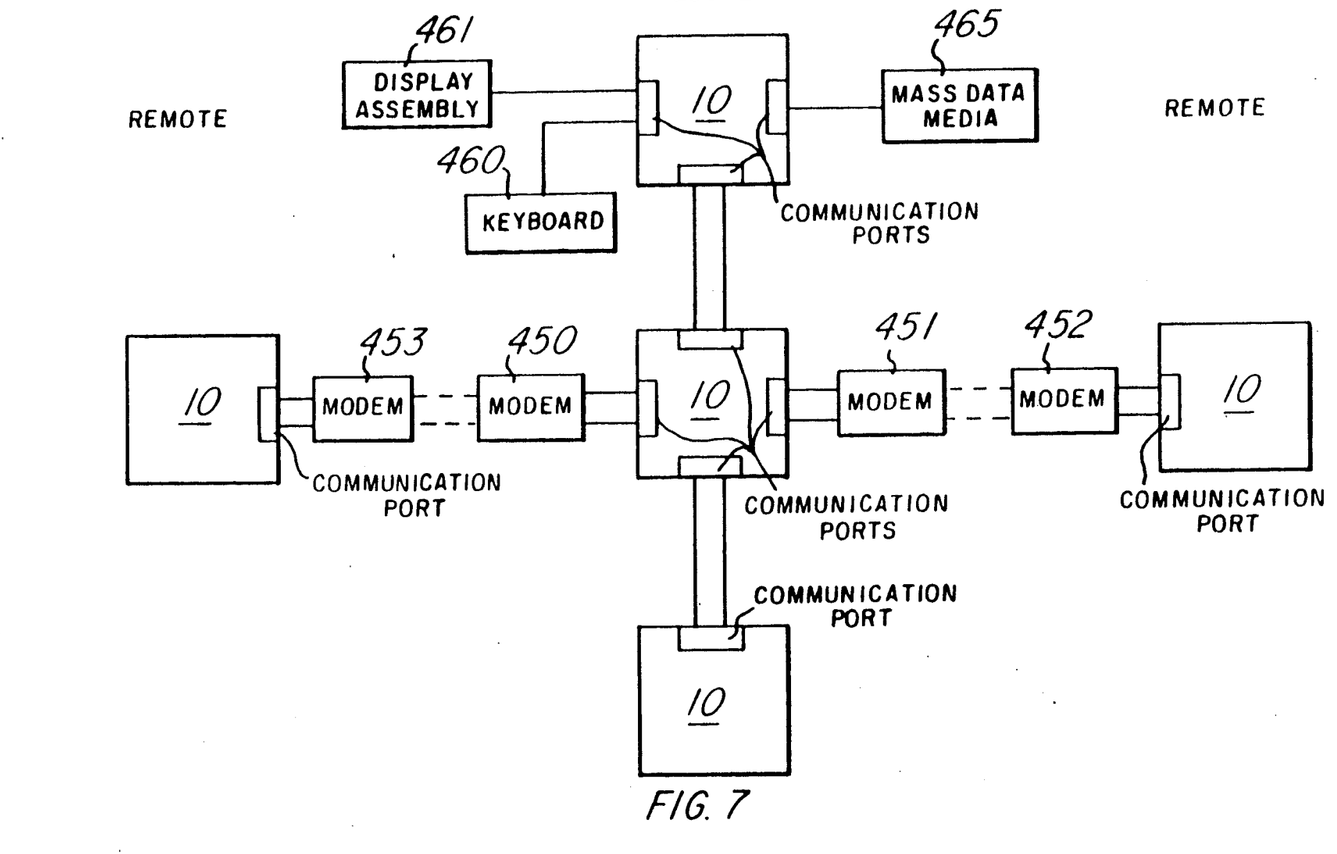
FIGS. 7–9 are electrical block diagrams of systems having computers and peripheral devices to which glitch protection is applied.

FIG. 7 illustrates a parallel processing system where some remote microcomputers 10 are connected via modem link 450, 451, 452 and 453 to their respective communication ports 50-55 while other local microcomputers 10 are connected directly via communication ports 50-55. Keyboard 460, display assembly 461 and mass data media 465 are connected to local microcomputer 10 via communication ports.

Figure 8:
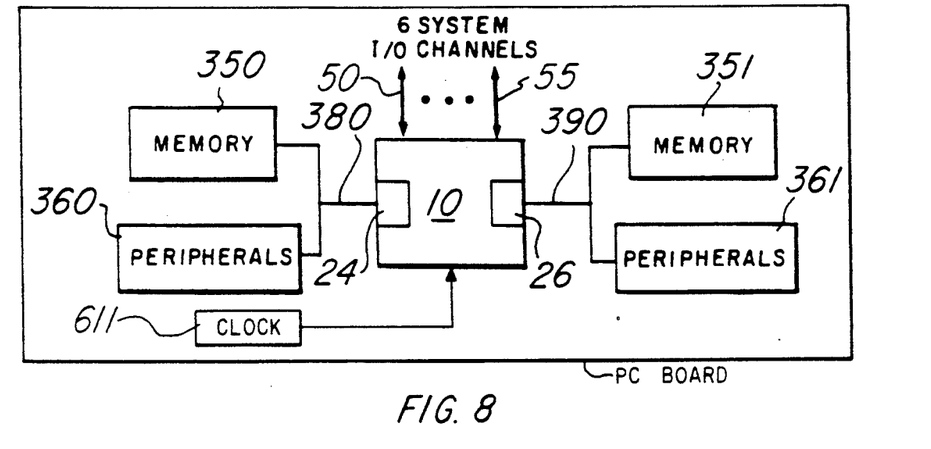

FIG. 8 shows an embodiment of a stand alone configuration of a data processing system improved with glitch protection and having a glitch protected integrated circuit 10 connected to a plurality of glitch protected memories, 350 and 351, and peripheral devices 360 and 361 all having integrated circuits improved with glitch protection according to the glitch circuitry described herein. Global peripheral port 24 and local peripheral port 26 of integrated circuit 10 have buffers and provide an interface to the external devices. For example, bus 380 can be used for program accesses and bus 390 can be concurrently used for data or I/O accesses.

In FIG. 8 the system has a printed circuit board having conductors thereon and holding the components and interconnecting them. A clock oscillator circuit 611 is mounted on the printed circuit board for generating clock pulses having a clock period or repetition rate on the order of 1 to 200 MHz. For example a 40 MHz. clock has a period of 25 nanoseconds. With 50% duty cycle, the clock is low for about 12.5 nanoseconds, and high for the same time. The processor integrated circuit 10 is mounted on the printed circuit board and has a clock input connected by a conductor of the printed circuit board to clock circuit 611. This input is potentially subject to clock glitches due to noise and ringing. According to the glitch removal principles and circuitry described herein, a one-shot circuit is fed from the clock input. Functional circuitry is clocked by the one-shot circuit so that clock glitches are filtered out.

Integrated circuit 10 as a microcomputer suitably also has available six communications channels with additional buffers interfacing to other systems in I/O intensive applications. Peripherals and other external devices such as keyboards, monitors, disk drives, printers, displays, transducers, modems, other processors, local area networks (LANs), and other known or hereafter devised apparatus with which the system commends its use can be connected to the peripheral ports 24 and 26 and communication ports 50–55. Any or all of the integrated circuits in any one, some, or all of these devices and apparatus are suitably improved with glitch protection as described herein.

Figure 9:
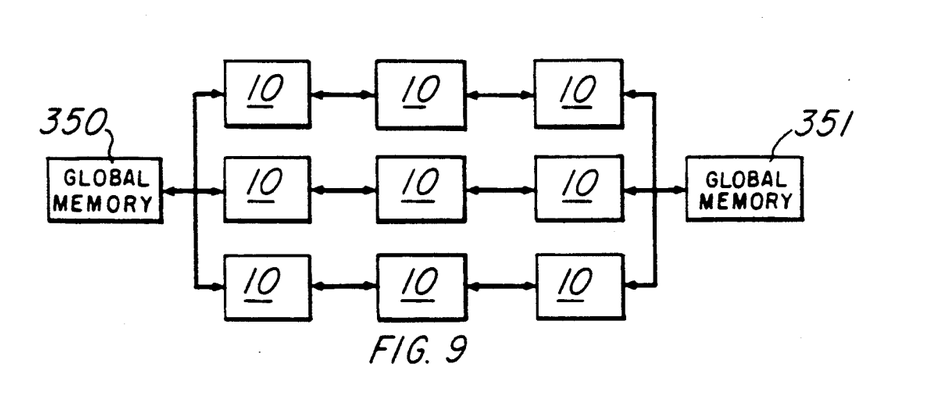

FIG. 9 shows another embodiment of a parallel processing system architecture configuration combining shared memories 350 and 351 and microcomputers 10 intercommunicating. All of these chips are suitably improved with glitch protection as described herein.

Figure 10:
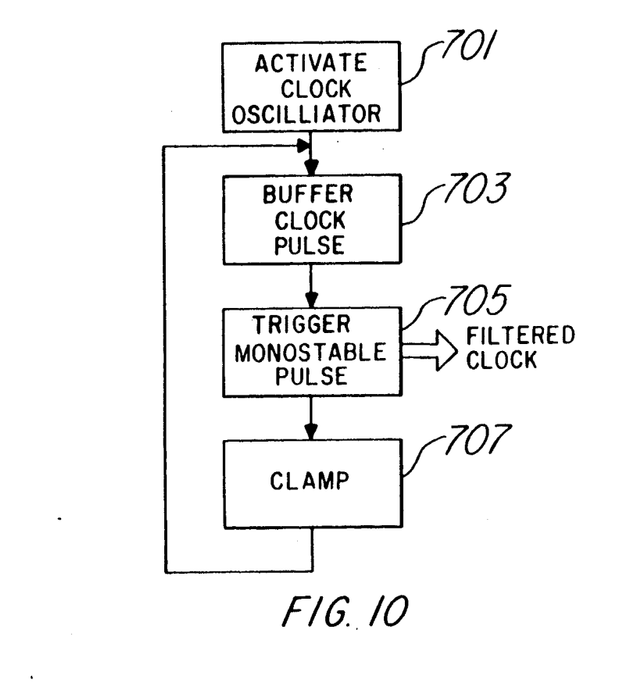
FIG. 10 is a flow diagram depicting a method of operation of the circuitry of FIG. 2.

In FIG. 10 a method of filtering clock glitches in an integrated circuit begins with a step 701 of powering up, or activating, the clock oscillator 611. Then a step 703 buffers each clock pulse and internally cascades and passes the buffered clock pulse through inverters which makes the clock pulse propagate slower when transitioning in one sense than when it transitions in the opposite sense. Next a step 705 internally initiates or triggers a one-shot clock signal in the integrated circuit in response to a clock pulse externally supplied to the integrated circuit that has passed through the inverter chain. A succeeding step 707 clamps one of the inverters when the one-shot triggers. Operations loop back to step 703 to process each next clock pulse. Filtered clock output from the one-shot is fed to the integrated circuitry for clocking it.

Figure 11:
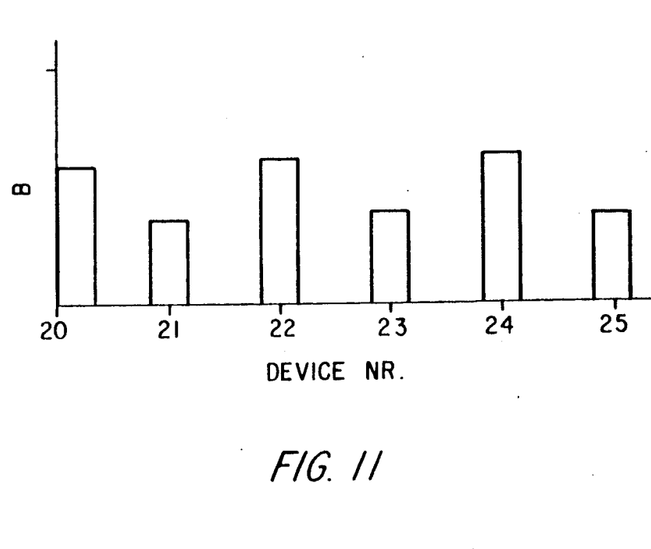
FIG. 11 is a graph of beta ratio of W/L in upper transistor to W/L in lower transistor in the series of inverters of FIG. 2.

In FIG. 11 the beta ratio of inverter 20 is higher than the beta of inverter 21. The beta of inverter 21 is less than the beta of inverter 22. The betas alternate high-low, high-low, high-low along the series of inverters so that the leading edge of a glitch propagates faster than the trailing edge, thereby suppressing glitches. Put another way, each inverter is arranged to delay, or take longer to respond to, the leading edge of a glitch than to the trailing edge of the glitch. Since the inverter inverts, this leads to the desirability of the alternating beta ratio feature, because the direction of transition of a given edge changes with each successive inversion. The selection of which transition is regarded as the leading edge of a glitch depends on whether the circuit is to respond to the rising or falling transition of the clock pulse. Thus, different embodiments can have different sequences of beta, and voltage threshold, depending on the particulars of the situation. Ellipsis dots are also indicated at the right of the diagram to indicate that the inverter string can be longer, or shorter, than the specific example shown, depending on the amount of delay desired, and the delay characteristics of the devices used.

Figure 12:
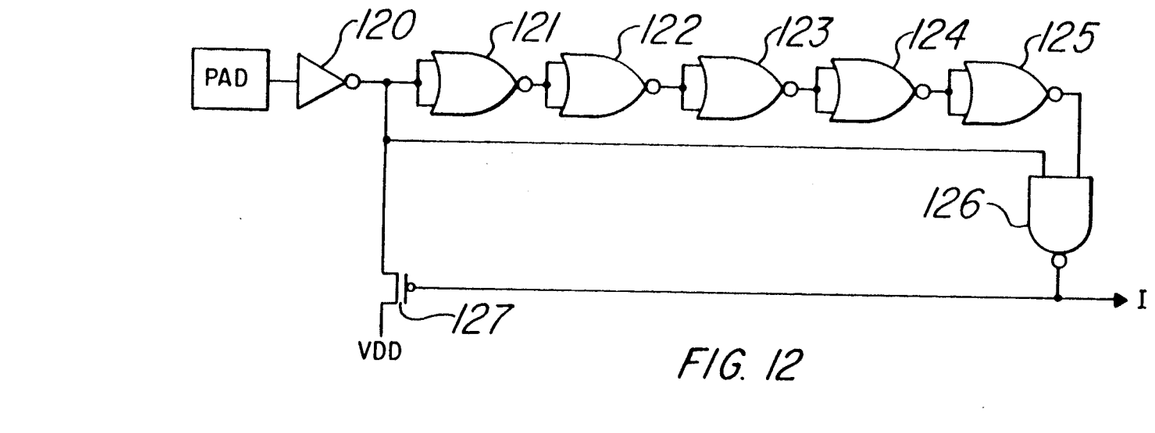
FIG. 12 is a schematic diagram of an alternative form of glitch suppressing circuit.

In FIG. 12 an alternative embodiment of a glitch suppressing circuit has the pad connected to an inverter 120. The output of inverter 120 feeds a string of five NOR gates 121, 122, 123, 124, 125 connected serially, each NOR-gate connected with both inputs connected to the output of its previous NOR-gate. The output of NOR-gate 125 is connected to an input of a NAND gate 126. A second input of NAND gate 126 is connected to the output of inverter 120. A p-channel clamp transistor 127 has its gate fed by output I of NAND gate 126. Clamp transistor 127 has source and drain connected between the input of NOR-gate 121 and supply rail VDD.

Figure 13:
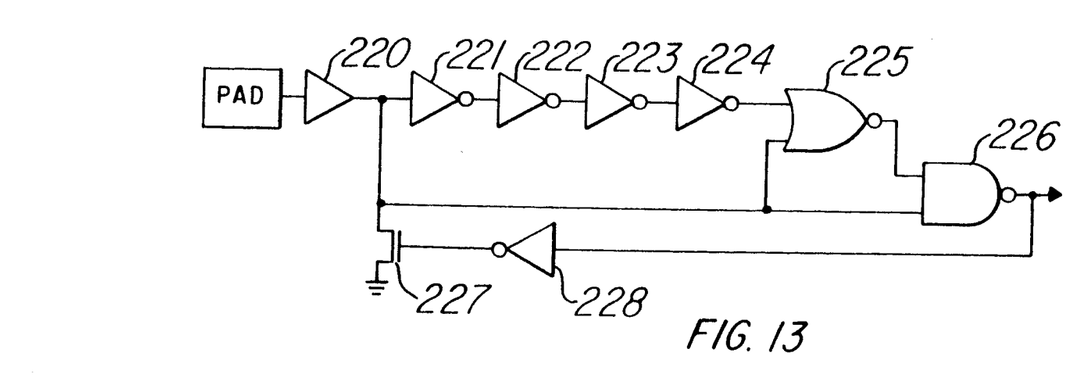
FIG. 13 is a schematic diagram of an another alternative form of glitch suppressing circuit.

In FIG. 13 a clock pad is connected to the input of a noninverting buffer 220. The output of noninverting buffer 220 feeds an even-numbered series of cascaded inverters 221, 222, 223, 224. The output of inverter 224 is connected to an input of a NOR gate 225. The output of NOR gate 225 is connected to an input of a NAND gate 226. A second input of NOR gate 225 and a second input of NAND gate 226 are connected together and to the output of noninverting buffer 220. The source and drain of an n-channel enhancement mode field effect transistor 227 are connected between the input of inverter 221 and circuit common, or ground reference. The output of NAND gate 226 is the output of the glitch suppression circuit, and it is also connected to the input of an inverter 228 which in turn has its output connected to the gate of transistor 227.

In other embodiments an inverter can be replaced with a NOR or NAND gate with all inputs tied together, or with a NOR gate with all but one input tied low, or with a NAND gate with all but one input tied high. Numerous other alternative embodiments can be devised based on the principles and examples disclosed herein, to perform glitch suppression.

A few preferred embodiments have been described in detail hereinabove. It is to be understood that the scope of the invention also comprehends embodiments different from those described, yet within the scope of the claims.

"Microcomputer" in some contexts is used to mean that microcomputer requires a memory and "microprocessor" does not. The usage herein is that these terms can also be synonymous and refer to equivalent things. The phrase "processing circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections can be ohmic, capacitive, direct or indirect, via intervening circuits or otherwise. Semiconductors of p-type can be changed to n-type, and vice-versa, with circuit voltages reversed in polarity. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit having a clock input pad and comprising:
   a. circuitry operative in response to a clock signal having transitions, said clock transitions at said clock input pad being potentially subject to glitches; and
   b. a glitch remover circuit having a logic gate having first and second inputs, said glitch remover circuit having a series of circuits coupled between said clock input pad and said first input, each one of said series of circuits having differing delays for positive signal edges than for negative signal edges, said second input coupled to the input of one of said series of circuits.

2. The integrated circuit of claim 1 wherein said series of circuits includes at least four inverters, alternating ones of said inverters having alternately relatively higher and lower beta values.

3. The integrated circuit of claim 1 wherein said logic gate has an output, the integrated circuit further comprising a field effect transistor having a gate and connected between said second input of said logic gate and a voltage source, said gate coupled to the output of said logic gate.

4. The integrated circuit of claim 1 wherein the series of circuits each has a different voltage threshold to propagate a positive-going signal at a different speed than a negative-going signal.

5. The integrated circuit of claim 1 wherein said series of circuits propagate a positive-going signal faster than a negative-going signal.

6. The integrated circuit of claim 1 wherein said series of circuits includes at least three circuits, each of said circuits having a first field effect transistor device, the width to length (W/L) ratio of said first field effect transistor device being substantially the same in a first and third of said three circuits and different in a second circuit disposed between said first and third circuits in said series of circuits.

7. The integrated circuit of claim 6 wherein each of said circuits further includes a second field effect transistor device of opposite conductivity type from said first field effect transistor, the width to length (W/L) ratio for the second device in said first and third of said three circuits in said series of circuits being different from the second device in the second of said series of circuits.

8. An integrated circuit having:
   (a) a clock input,
   (b) a one-shot circuit fed from said clock input, and
   (c) functional circuitry clocked by said one-shot circuit filtering out glitches in said clock input;
   (d) wherein said one-shot circuit comprises a plurality of circuits connected in series, each circuit of said plurality of circuits having a threshold different form the immediately prior and immediately succeeding circuits, said immediately prior and immediately succeeding circuits having substantially the same threshold and a logic gate with a first input fed by said series of circuits and a second input connected to an input of one of said series of circuits and an output and a clamp circuit controlled by the output of said logic gate, said clamp circuit connected to said second input.

9. A method of filtering clock glitches in an integrated circuit comprising the step of:
   (a) providing an integrated circuit having a one-shot; and
   (b) internally initiating a one-shot clock signal from said one-shot in said integrated circuit in response to a clock pulse externally supplied to the integrated circuit;
   (c) further comprising the step of internally cascading said clock pulse through circuits which make the clock pulse propagate slower when transitioning in one sense than when it transitions in the opposite sense.

10. The method of claim 9 further comprising the step of clamping an input of one of said circuits in response to said one-shot clock signal.

11. An integrated circuit having a clock input pad and comprising:
   (a) circuitry operative in response to a clock signal having transitions, said clock transitions at the clock input pad being potentially subject to glitches; and
   (b) a glitch remover circuit having a logic gate having first and second inputs, said glitch remover circuit having a series of circuits coupled between said clock input pad and said first input alternate ones of said series of circuits having alternately higher and lower beta values, the series of circuits having an output connected to said first input of said logic gate, said second input coupled to an input of one of said series of circuits.

12. The integrated circuit of claim 11 further comprising a clamp connected between one of said circuits and a voltage source and having an input coupled to the output of said logic gate.

13. The integrated circuit of claim 11 wherein the series of circuits includes at least three circuits, each of said circuits having a first field effect transistor device, the width to length (W/L) ratio of said first field effect transistor device being substantially the same in a first and third circuit of said series of circuits and different from said first and third circuits in a second circuit between said first and second circuits.

14. The integrated circuit of claim 13 wherein each of said circuits also has a second field effect transistor device of opposite conductivity type from said first field effect transistor, the width to length (W/L) ratio of said second field effect transistor being substantially the same in said first and third circuits and different in said second circuit between said first and third circuits.

15. An integrated circuit having a clock input pad and comprising:

(a) functional circuitry operative in response to a clock signal having clock transitions, said clock transitions at said clock input pad being potentially subject to glitches;

(b) a glitch remover circuit having a series of circuits coupled to said clock input pad; and (c) a clamp connected between one of said circuits and a voltage source and having an input coupled to another of said circuits, the series of circuits having an output connected to supply a signal as the clock signal to the functional circuitry.

16. The integrated circuit of claim 15 wherein said series of circuits includes a series of inverters of alternating relatively lower and higher beta values and a logic gate fed by one of said inverters.

* * * * *